US011942369B2

(12) United States Patent
Krishnan et al.

(10) Patent No.: US 11,942,369 B2
(45) Date of Patent: Mar. 26, 2024

(54) THIN SEMICONDUCTOR PACKAGE FOR NOTCHED SEMICONDUCTOR DIE

(71) Applicant: SEMICONDUCTOR COMPONENTS INDUSTRIES, LLC, Phoenix, AZ (US)

(72) Inventors: Shutesh Krishnan, Negeri Sembilan (MY); Sw Wei Wang, Seremban (MY); Ch Chew, Seremban (MY); How Kiat Liew, Bukit Jalil (MY); Fui Fui Tan, Seremban (MY)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

(21) Appl. No.: 16/942,916

(22) Filed: Jul. 30, 2020

(65) Prior Publication Data
US 2020/0357697 A1 Nov. 12, 2020

Related U.S. Application Data

(60) Division of application No. 16/395,822, filed on Apr. 26, 2019, now Pat. No. 10,763,173, which is a
(Continued)

(51) Int. Cl.
*H01L 21/768* (2006.01)
*H01L 21/306* (2006.01)
(Continued)

(52) U.S. Cl.
CPC ............ *H01L 21/78* (2013.01); *H01L 21/306* (2013.01); *H01L 21/56* (2013.01); *H01L 21/561* (2013.01);
(Continued)

(58) Field of Classification Search
CPC ....... H01L 21/78; H01L 21/306; H01L 21/56; H01L 21/561; H01L 23/3114; H01L 23/482; H01L 29/0657
See application file for complete search history.

(56) References Cited

U.S. PATENT DOCUMENTS 7,939,916 B2 * 5/2011 O'Donnell .......... H01L 23/3171
257/659
8,026,599 B2 * 9/2011 O'Donnell ............ H01L 23/552
257/734
(Continued)

FOREIGN PATENT DOCUMENTS

CN 101552248 A 10/2009

*Primary Examiner* — Marcos D. Pizarro
*Assistant Examiner* — Tenley H Schofield
(74) *Attorney, Agent, or Firm* — Adam R. Stephenson, LTD.

(57) ABSTRACT

Implementations of a method of forming a semiconductor package may include forming a plurality of notches into a first side of a wafer, the first side of the wafer including a plurality of electrical contacts. The method may also include coating the first side of the wafer and an interior of the plurality of notches with a molding compound, grinding a second side of the wafer to thin the wafer to a desired thickness, forming a back metal on a second side of the wafer, exposing the plurality of electrical contacts through grinding a first side of the molding compound, and singulating the wafer at the plurality of notches to form a plurality of semiconductor packages.

15 Claims, 4 Drawing Sheets

Related U.S. Application Data continuation of application No. 15/679,664, filed on Aug. 17, 2017, now Pat. No. 10,319,639.

(51) Int. Cl.

| | | |
|---|---|---|
| *H01L 21/56* | (2006.01) | |
| *H01L 21/78* | (2006.01) | |
| *H01L 23/00* | (2006.01) | |
| *H01L 23/31* | (2006.01) | |
| *H01L 23/367* | (2006.01) | |
| *H01L 23/482* | (2006.01) | |
| *H01L 23/495* | (2006.01) | |
| *H01L 23/522* | (2006.01) | |
| *H01L 23/528* | (2006.01) | |
| *H01L 23/532* | (2006.01) | |
| *H01L 25/065* | (2023.01) | |
| *H01L 29/06* | (2006.01) | |

(52) U.S. Cl.
CPC ........ *H01L 23/3114* (2013.01); *H01L 23/482* (2013.01); *H01L 29/0657* (2013.01)

(56) References Cited

U.S. PATENT DOCUMENTS

| | | | |
|---|---|---|---|
| 8,048,781 B2 * | 11/2011 | How | H01L 24/27 438/464 |
| 8,828,848 B2 * | 9/2014 | Lin | H01L 24/97 257/676 |
| 9,165,886 B2 | 10/2015 | Bowles et al. | |
| 9,496,193 B1 | 11/2016 | Roesner et al. | |
| 9,653,383 B2 | 5/2017 | Yilmaz et al. | |
| 10,319,639 B2 | 6/2019 | Krishnan et al. | |
| 2007/0087544 A1 | 4/2007 | Chang et al. | |
| 2008/0014677 A1 | 1/2008 | Xiaochun et al. | |
| 2008/0029847 A1 * | 2/2008 | Guillermo | H01L 21/6836 257/E29.022 |
| 2008/0227240 A1 | 9/2008 | Sharma et al. | |
| 2008/0251902 A1 | 10/2008 | Masuda et al. | |
| 2009/0215227 A1 * | 8/2009 | Tan | H01L 23/3114 438/106 |
| 2011/0031614 A1 * | 2/2011 | Farnworth | H01L 21/561 257/E23.116 |
| 2011/0175242 A1 | 7/2011 | Grivna et al. | |
| 2012/0104580 A1 * | 5/2012 | Feng | H01L 29/0657 257/673 |
| 2013/0037917 A1 * | 2/2013 | Xue | H01L 23/3114 257/E23.033 |
| 2013/0037935 A1 * | 2/2013 | Xue | H01L 23/3114 257/737 |
| 2013/0037966 A1 * | 2/2013 | Qiu | H01L 21/78 257/782 |
| 2013/0344652 A1 | 12/2013 | Haba et al. | |
| 2014/0091458 A1 * | 4/2014 | Van Gemert | H01L 21/6836 257/737 |
| 2014/0110842 A1 * | 4/2014 | Zenz | H01L 23/3178 257/738 |
| 2014/0183761 A1 * | 7/2014 | Lin | H01L 24/97 257/787 |
| 2014/0225230 A1 * | 8/2014 | Kim | H01L 21/563 257/620 |
| 2014/0242756 A1 * | 8/2014 | Xue | H01L 21/78 438/113 |
| 2014/0264802 A1 | 9/2014 | Yilmaz et al. | |
| 2015/0021754 A1 * | 1/2015 | Lin | H01L 24/19 438/122 |
| 2015/0162306 A1 * | 6/2015 | Van Gemert | H01L 21/568 438/113 |
| 2015/0357256 A1 * | 12/2015 | Suthiwongsunthorn | H01L 23/544 257/734 |
| 2015/0364376 A1 | 12/2015 | Yu et al. | |
| 2016/0225733 A1 | 8/2016 | Wilcoxen | |
| 2016/0254415 A1 | 9/2016 | Kaempf et al. | |
| 2017/0098612 A1 | 4/2017 | Lin et al. | |
| 2017/0236765 A1 | 8/2017 | Tamagawa et al. | |
| 2018/0005912 A1 * | 1/2018 | Oh | H01L 21/561 |
| 2018/0166396 A1 | 6/2018 | Lee et al. | |

* cited by examiner

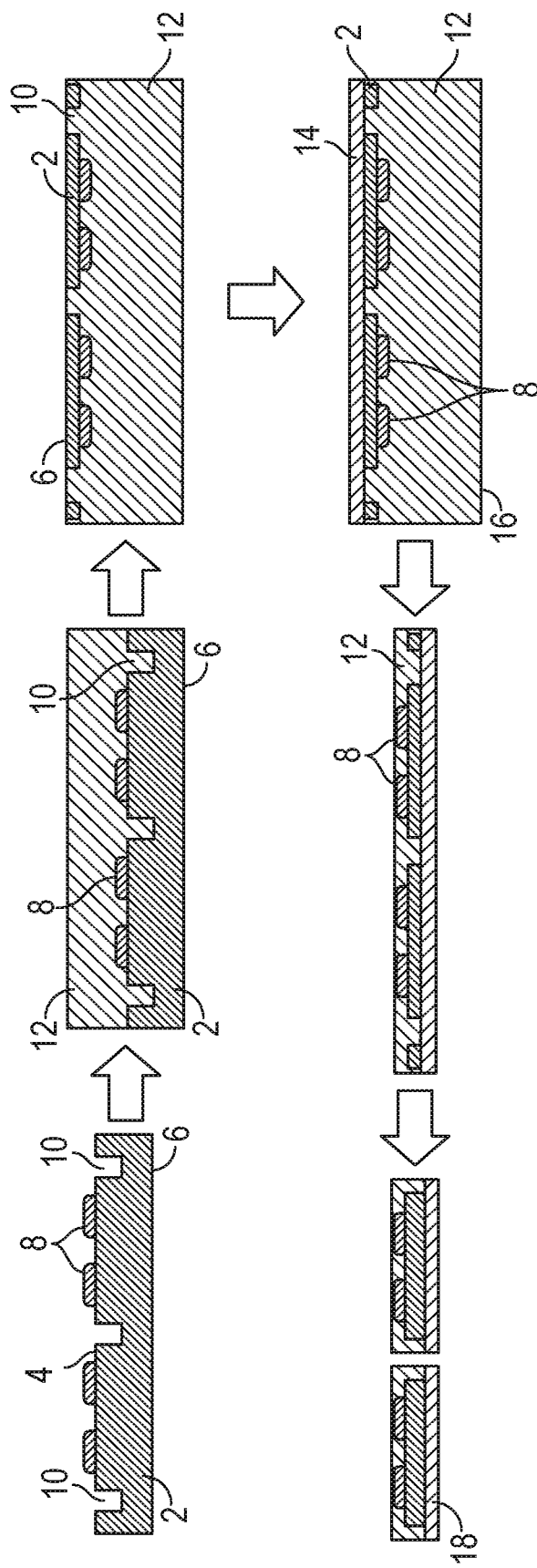
FIG. 1
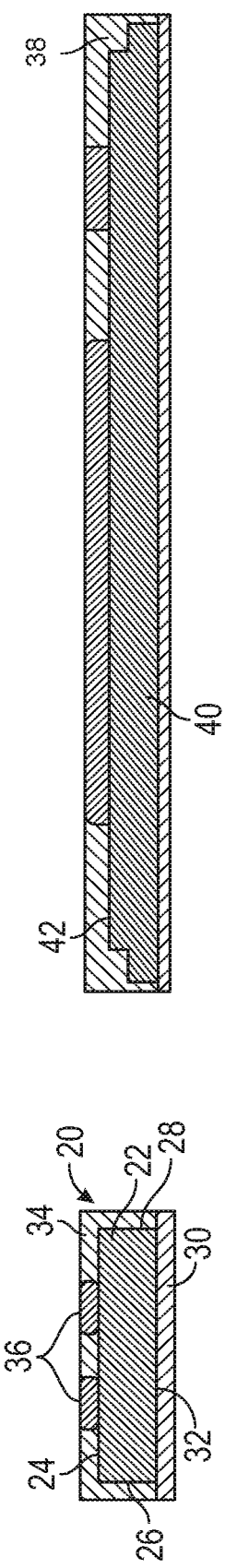
FIG. 2
FIG. 3

THIN SEMICONDUCTOR PACKAGE FOR NOTCHED SEMICONDUCTOR DIE

CROSS REFERENCE TO RELATED APPLICATIONS

This application is a divisional of the earlier U.S. Utility Patent Application to Krishnan entitled "Thin Semiconductor Package and Related Methods," application Ser. No. 16/395,822, filed Apr. 26, 2019, now pending; which was a continuation application of the earlier U.S. Utility Patent Application to Krishnan entitled "Thin Semiconductor Package and Related Methods," application Ser. No. 15/679,664, filed Aug. 17, 2017, now U.S. Pat. No. 10,319,639, issued Jun. 11, 2019; the disclosures of each of which are hereby incorporated entirely herein by reference.

BACKGROUND

1. Technical Field

Aspects of this document relate generally to semiconductor packages. More specific implementations involve thin power semiconductor packages and methods of making thin power semiconductor packages.

2. Background

Decreasing semiconductor package size generally has resulted in economic benefits as well as technological benefits, such as an increase in speed and power of the semiconductor device. Thin semiconductor packages are advantageous for chip stacking technologies. The semiconductor packages may be formed from thinned die made from ground semiconductor wafers.

SUMMARY

Implementations of a method of forming a semiconductor package may include forming a plurality of notches into a first side of a wafer, the first side of the wafer including a plurality of electrical contacts. The method may also include coating the first side of the wafer and an interior of the plurality of notches with a molding compound, grinding a second side of the wafer to thin the wafer to a desired thickness, forming a back metal on a second side of the wafer, exposing the plurality of electrical contacts through grinding a first side of the molding compound, and singulating the wafer at the plurality of notches to form a plurality of semiconductor packages.

Implementations of methods of forming semiconductor packages may include one, all, or any of the following:

The method may include forming a groove through the back metal on the second side of the wafer, coating the second side of the wafer and the back metal layer with a second molding compound, and grinding the second molding compound to a desired thickness.

The plurality of notches may be formed using an etching technique.

Each notch in the plurality of notches may be a stepwise notch.

A portion of the wafer may separate the back metal and the plurality of notches.

The first molding compound may be applied using one of a liquid dispensing method, a transfer molding method, and a compression molding method.

Substantially 90 percent of a back portion of the wafer may be removed during grinding the second side of the wafer.

The first molding compound may be cured between 100 and 200 degrees Celsius with a pressure of substantially 5 psi applied to the second side of the wafer.

Implementations of a method of forming a semiconductor package may include forming a plurality of notches into a second side of a wafer opposite a first side of a wafer, the first side of the wafer including a plurality of electrical contacts. The method may include coating the first side of the wafer with a first molding compound, coating the second side of the wafer with a second molding compound, grinding the second molding compound to a desired thickness, forming a metal layer over the second molding compound and the second side of the wafer, exposing the plurality of electrical contacts through grinding a first side of the first molding compound, and singulating the wafer along the plurality of notches forming a plurality of semiconductor packages.

Implementations of methods of forming semiconductor packages may include one, all, or any of the following:

The plurality of notches may be formed using an etching technique.

The first molding compound may be applied using one of a liquid dispensing method, a transfer molding method, and a compression molding method.

The first molding compound and the second molding compound may be ground using one of a mechanical polishing and a chemical etching technique.

Implementations of a semiconductor package may include a die including a first side, a second side, a third side, a fourth side, a fifth side, and a sixth side, the die having a thickness between the first side and the second side, the thickness being less than 25 microns thick. The package may also include a plurality of electrical contacts coupled to the first side of the die, a first mold compound covering a portion of the first side of the die, a portion of the second side of the die, a portion of the third side of the die, a portion of the fourth side of the die, and a portion of the fifth side of the die, wherein the plurality of electrical contacts are exposed through the first molding compound, and a metal layer coupled to the sixth side of the die.

Implementations of a semiconductor packages may include one, all, or any of the following:

The first side of the die may include a notch around a perimeter of the die.

The sixth side of the die may include a notch around a perimeter of the die.

The wafer may be less than 10 microns thick.

The first mold compound may completely cover the second side of the die, the third side of the die, the fourth side of the die, and the fifth side of the die.

The sixth side of the die may be covered by a second mold compound.

The edges of the metal layer may be covered by the first mold compound.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 1 is an illustration of a process flow for forming an ultra-thin semiconductor package;

FIG. 2 is a cross sectional view of an ultra-thin semiconductor package formed by the process of FIG. 1;

FIG. 3 is a cross sectional view of an ultra-thin semiconductor package with a notch formed therein;

DESCRIPTION

Figure 4:
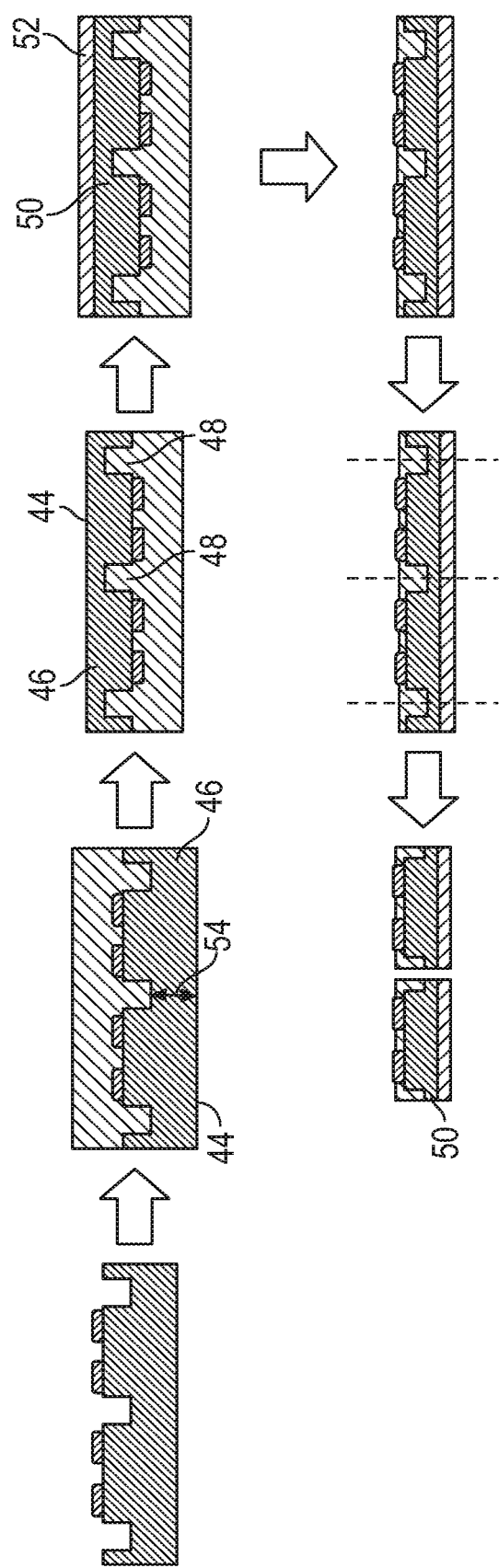
FIG. 4 is an illustration of a process flow for forming an ultra-thin semiconductor package with a portion of the die exposed.

This disclosure, its aspects and implementations, are not limited to the specific components, assembly procedures or method elements disclosed herein. Many additional components, assembly procedures and/or method elements known in the art consistent with the intended ultra-thin semiconductor package will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such ultra-thin semiconductor packages, and implementing components and methods, consistent with the intended operation and methods.

Referring to FIG. 1, a process flow for forming an ultra-thin semiconductor package is illustrated. As used herein, an "ultra-thin" semiconductor package is designed to handle a device die of about 25 microns in thickness or thinner. The process flow illustrates cross sectional side views of the wafer and die. In various implementations, a method for forming an ultra-thin semiconductor package includes providing a wafer 2 with a first side 4 and a second side 6. The wafer 2 may include a substrate material which may be, by non-limiting example, silicon, gallium nitride, silicon carbide, or another wafer substrate material. The first side of the wafer 4 includes or is coupled to a plurality of electrical contacts 8. The electrical contacts 8 may be metallic or made of another material that is electrically conductive.

In various implementations, the method for forming the ultra-thin semiconductor package includes forming a plurality of notches 10 in the first side 4 of the wafer 2. While not shown in FIG. 1, it is understood that the plurality of notches intersect one another in a substantially perpendicular direction across the first side 4 of the wafer 2. In various implementations, the notches formed may extend about 25 or more microns deep into the wafer. In other implementations, the notches 10 only extend between about 10 and about 25 microns deep in the wafer 2. In still other implementations, the notches 10 extend less than about 10 microns deep in the wafer 2. The plurality of notches may be formed using, by non-limiting example, a saw, a laser, a waterjet, plasma etching, or chemical etching. In various implementations, a chemical etching process marketed under the tradename BOSCH® (the "Bosch process") by Robert Bosch GmbH, Stuttgart Germany, may be used to form the notches 10 in the first side 4 of the wafer 2.

In various implementations, the notches 10 formed have two substantially parallel sidewalls that extend substantially straight into the first side 4 of the wafer 2. In other implementations, a plurality of stepwise notches are formed in the first side 4 of the wafer 2. Each stepwise notch may be formed by forming a first notch in the wafer having a first width, and then forming a second notch with a second width within each first notch where the first width is wider than the second width.

The method for forming the ultra-thin semiconductor package includes coating the first side 4 of the wafer 2 and the interiors of the plurality of notches 10 with a molding compound 12. The molding compound may also cover the electrical contacts 8 in various method implementations. The molding compound 12 may be applied using, by non-limiting example, a liquid dispensing technique, a transfer molding technique, or a compression molding technique.

The molding compound may be an epoxy molding compound, an acrylic molding compound, or any other molding compound capable of hardening and providing physical support and/or humidity protection to a semiconductor device. In various implementations, the molding compound 12 may be cured under a temperature between about 100-200 degrees Celsius and while a pressure of substantially 5 psi is applied to the second side 6 of the wafer. In other implementations, the molding may be cured with different temperatures and different pressures. In implementations with an epoxy molding compound, after the molding compound 12 is applied, it may be heat treated to enhance the epoxy cross linking.

In various implementations, the method for forming an ultra-thin semiconductor package includes grinding the second side 6 of the wafer 2 to a desired thickness. In various implementations the second side 6 of the wafer 2 may be ground away to an extent that the plurality of notches 10 filled with molding compound 12 extends completely through the wafer. In various implementations, more than this may be ground away, thus decreasing the depth of the notches 10. In this way the semiconductor devices in the wafer are separated from each other, but still held together through the molding compound. Because the molding compounds now supports the semiconductor devices, the devices can be ground very thin. In various implementations, the second side 6 of the wafer 2 may be ground using, by non-limiting example, a mechanical polishing technique, a chemical etching technique, a combination of a mechanical polishing and chemical etching technique, or any other grinding technique. In various implementations, the wafer is ground to a thickness between about 10 and about 25 microns. In other implementations, the wafer is ground to a thickness less than about 10 microns. In still other implementations, the wafer may be ground to a thickness more than about 25 microns.

In various implementations, the method for forming an ultra-thin semiconductor package includes forming a back metal 14 on the second side 6 of the wafer 2. The back metal may include a single metal layer or multiple metal layers. In various implementations, the back metal may include, by non-limiting example, gold, titanium, nickel, silver, copper, or any combination and/or alloy thereof. Because the wafer 2 is thinned and the back metal 14 is applied to the thinned wafer while the entirety of the molding compound 12 is coupled to the front side 4 of the wafer 2 and the interior of the notches 10, it may be possible to reduce or eliminate warpage of the wafer. Further, wafer handling issues are reduced when thinning the wafer and applying the back metal 14 because the entirety of the molding compound 12 is still coupled to the wafer 2. Furthermore, curling and warpage of the extremely thin semiconductor die now coated with back metal are significantly reduced due to the support provided by the molding compound.

In various implementations, the method for forming an ultra-thin semiconductor package includes exposing the plurality of electrical contacts 8 covered by the molding compound 12 by grinding a first side 16 of the molding compound 12. The first side 16 of the molding compound 12 may be ground using, by non-limiting example, a mechanical polishing technique, a chemical etching technique, a combination of a mechanical polishing and chemical etching technique, or other grinding technique.

In various implementations, the method for forming an ultra-thin semiconductor package includes singulating the wafer 2 into single die. The wafer may be singulated by cutting or etching through the wafer where the plurality of notches 10 were originally formed. The wafer may be singulated by using, by non-limiting example, a saw, a laser, a waterjet, plasma etching, or chemical etching. In various implementations, the Bosch process previously mentioned may be used to singulate the wafer 2. The method used to the singulate the wafer may include singulating the wafer using thinner cuts or etches than were used to form the plurality of notches 10. In this manner, the molding compound 12 will cover the sides of each singulated die 18.

Referring to FIG. 2, a cross sectional view of an ultra-thin semiconductor package formed by the process of FIG. 1 is illustrated. In various implementations, the ultra-thin semiconductor package 20 may be a power semiconductor package. Specifically, the ultra-thin semiconductor package may be a MOSFET. In other implementations, the ultra-thin semiconductor package 20 is not used for a power semiconductor device, but may be used for other semiconductor device types. In various implementations, the ultra-thin semiconductor package has a plurality of electrical contacts 36 coupled to the first side 24 of the die and exposed through a first molding compound 34. In various implementations, the die 22 of the semiconductor package 20 may be between about 10-25 microns thick. In other implementations, the die 22 is less than about 10 microns thick. In still other implementations, the die 22 may be more than about 25 microns thick. The ultra-thin nature of the power semiconductor package may improve the RDs(oN) of the package and/or semiconductor device/die.

In various implementations, the ultra-thin semiconductor package 20 is covered by the first molding compound 34 on a first side 24, a second side 26, a third side 28, a fourth side, and a fifth side of the die 22. A metal layer 30 may be coupled to a sixth side 32 of the die. In various implementations, more than one metal layer may be coupled to the sixth side 32 of the die. The metal may include, by non-limiting example, gold, titanium, nickel, silver, copper, or any combination or alloy thereof.

Referring now to FIG. 3, a cross sectional view of an ultra-thin semiconductor package with a notch formed therein is illustrated. The package illustrated in FIG. 3 may be the same or similar to the package illustrated in FIG. 2, with the exception that the package illustrated in FIG. 3 includes a notch 38 around a perimeter of the first side 42 of the die 40. The notch 38 may result from forming a stepwise notch in a wafer as described above in relation to FIG. 1. In various implementations, the stepwise notch may not extend around the entire perimeter of the die, but may be formed just along two opposing edges of the first side 42 of the die 40.

Referring to FIG. 4, a process flow for another implementation of a method of forming an ultra-thin semiconductor package with a portion of the die exposed is illustrated. The method implementation illustrated in FIG. 4 is the same as the process illustrated by FIG. 1, with the exception that the second side 44 of the wafer 46 is not ground through to the plurality of notches 48. Because of this, a portion 50 of the wafer 46 exists between the plurality of notches 48 and the back metal 52. In various implementations, about 90-95% of the back portion 54 of the wafer 46, or the portion of the wafer that extends from the second side 44 of the wafer to the plurality of notches 48, is removed through grinding. In other implementations, more or less than this may be removed through grinding. The other process steps in the method implementation (molding, grinding, and singulation, etc.) are carried out similarly to the method implementation illustrated in FIG. 1 and described herein.

Figure 5:
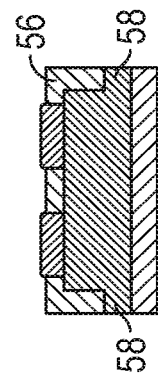
FIG. 5 is a cross sectional view of an ultra-thin semiconductor package formed by the process of FIG. 4.

Referring to FIG. 5, a cross sectional view of an ultra-thin semiconductor package formed by the process of FIG. 4 is illustrated. The semiconductor package of FIG. 5 may be the same as the semiconductor package of FIG. 2, with the exception that a portion of the die 58 is present between the molding compound and the back metal along the sides of the die. Thus, in the implementation illustrated by FIG. 5, a portion of the die 58 is exposed on the various opposing sides of the die.

Figure 6:
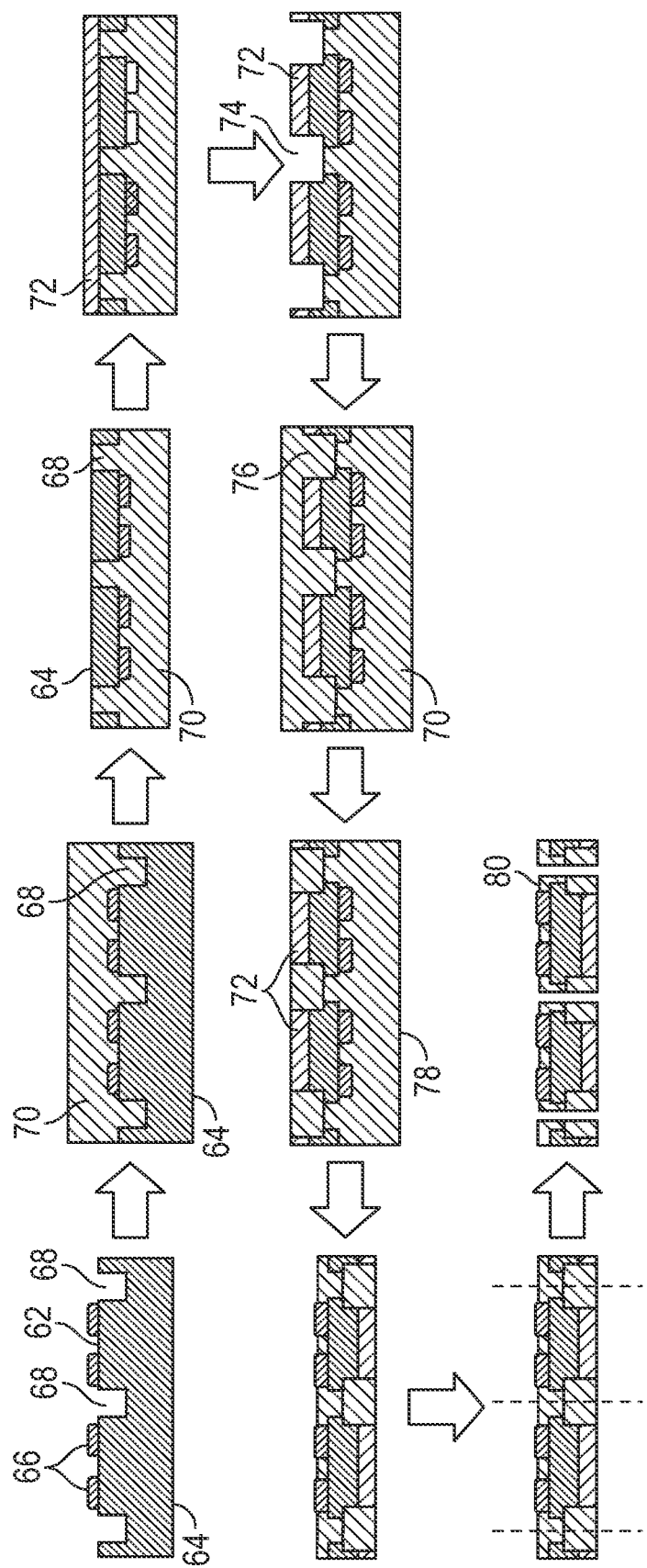
FIG. 6 is an illustration of a process flow for forming an ultra-thin semiconductor package with a notch formed therein.

Referring to FIG. 6, a process flow for another implementation of forming an ultra-thin semiconductor package with a notch formed therein is illustrated. The process flow illustrates cross sectional side views of the wafer and die. In various implementations, the method includes providing a wafer 60. The wafer 60 has a first side 62 and a second side 64. The wafer 60 may be, by non-limiting example, silicon, gallium nitride, silicon carbide, or other wafer material like those disclosed herein. The first side of the wafer 60 includes or is coupled to a plurality of electrical contacts 66. The electrical contacts 66 may be metallic or made of any other electrically conductive material disclosed herein.

In various implementations, the method includes forming a plurality of notches 68 in the first side 62 of the wafer 60. While not illustrated in FIG. 6, it is understood that the plurality of notches intersect one another in a substantially perpendicular direction. The notches 68 formed may be any depth previously disclosed herein, any shape previously disclosed herein (including stepwise), and formed using any method previously disclosed herein.

The method for forming the ultra-thin semiconductor package of FIG. 6 includes coating the first side 62 of the wafer and the interiors of the plurality of notches 68 with a molding compound 70. The molding compound may also cover the electrical contacts 66. The molding compound 70 may be applied using any method previously disclosed herein, and may be any type of molding compound previously disclosed herein. In various implementations, the molding compound may be cured or heat treated as described above in relation to FIG. 1.

In various implementations, the method for forming an ultra-thin semiconductor package includes grinding the second side 64 of the wafer to a desired thickness. The second side of the wafer may be ground using any grinding method disclosed herein, and may be ground to any thickness described herein. In various implementations the second side 64 of the wafer 60 may be ground away to an extent that the plurality of notches 68 filled with molding compound 70 extend completely through the wafer. In various implementations, more of the wafer material (and, correspondingly some of the molding compound) may be ground away, thus decreasing the depth of the notches 70.

In various implementations, the method for forming an ultra-thin semiconductor package includes forming a back metal 72 on the second side 64 of the wafer 60. The back metal may include a single metal layer or multiple metal layers. In various implementations, the back metal may include, by non-limiting example, gold, titanium, nickel, silver, copper, or any combination thereof.

The method of forming the ultra-thin semiconductor package as illustrated in FIG. 6 includes forming at least one groove 74 through the back metal 72. In various implementations, the at least one groove is aligned with a notch from the plurality of notches 68. In various implementations, there is a groove formed for every notch. In various implementations, the groove is wider than the notch, while in other implementations, the groove is as wide as, or less wide than, the corresponding notch. As illustrated in FIG. 6, the groove 74 may extend into the second side 64 of the wafer 60. In other implementations, the groove 74 may only extend through the thickness of the back metal 72.

Because the wafer 60 is thinned and the back metal 72 is applied to the thinned wafer while the entirety of the first molding compound 70 is coupled to the front side 62 of the wafer and the interior of the notches 68, it reduces warpage of the wafer. Further, wafer handling issues are reduced when thinning the wafer, applying the back metal 72, and forming the at least one groove 74 through the back metal because the entirety of the molding compound 70 is still coupled to the wafer as previously discussed.

The method implementation illustrated in FIG. 6 includes coating the second side 64 of the wafer 60 and the back metal layer 72 with a second molding compound 76. In this manner, as illustrated by FIG. 6, the first molding compound and the second molding compound may completely encapsulate the electrical contacts 66, the wafer 60, and the back metal 72. The second molding compound may be any type disclosed herein and may be applied and cured using any method described herein. In various implementations, the second molding compound may be chemically the same as the first molding compound, but it may be chemically different in other implementations. The method implementation illustrated in FIG. 6 includes grinding the second molding compound to a desired thickness. In various implementations, the second molding compound is ground to expose the back metal 72. The second molding compound may be ground using any grinding method disclosed herein.

In various implementations, the method for forming an ultra-thin semiconductor package includes exposing the plurality of electrical contacts 66 covered by the molding compound 70 by grinding a first side 78 of the molding compound 70. The first side 78 of the molding compound 70 may be ground using any method disclosed herein.

In various implementations, the method for forming an ultra-thin semiconductor package also includes singulating the wafer 60, first molding compound 70, and second molding compound 76 into single die packages (or multi-die packages as desired). The wafer may be singulated by cutting or etching through the wafer where the plurality of notches 68 were originally formed. The wafer may be singulated by using, by non-limiting example, a saw, a laser, a waterjet, plasma etching, or chemical etching. In various implementations, the Bosch process may be used to singulate the wafer 60, first molding compound 70, and second molding compound 76 into individual packages. The method used to the singulate the wafer may include singulating the wafer using thinner cuts or etches than were used to form the plurality of notches 68. In this manner the first molding compound 70 and second molding compound 76 cover all the sides of each singulated die 80 leaving the electrical contacts exposed.

Figure 7:
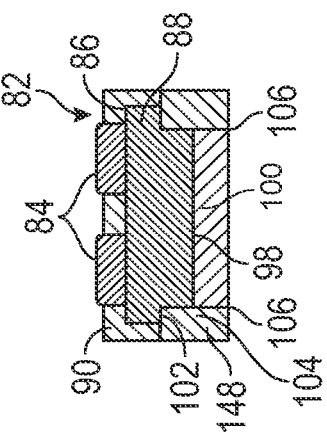
FIG. 7 is a cross sectional view of an ultra-thin semiconductor package formed by the process of FIG. 6.

Referring to FIG. 7, a cross sectional view of an ultra-thin semiconductor package formed by the process of FIG. 6 is illustrated. In various implementations, the ultra-thin semiconductor package 82 may include a power semiconductor device. Specifically, the ultra-thin semiconductor package may include a MOSFET. In other implementations, the ultra-thin semiconductor package 82 may not include a power semiconductor device.

In various implementations, the ultra-thin semiconductor package 82 has a plurality of electrical contacts 84 coupled to the first side 86 of the die and exposed through a first molding compound 90.

In various implementations, the die 88 of the semiconductor package 82 may be between about 10-25 microns thick. In other implementations, the die 88 is less than about 10 microns thick. In still other implementations, the die 88 may be more than about 25 microns thick. As previously discussed, the ultra-thin nature of the power semiconductor package may improve the RDS(ON) of the package.

In various implementations, the ultra-thin semiconductor package 82 is covered by the first molding compound 90 on a first side 86 and by the first molding compound 90 and the second molding compound 148 on a second side, a third side, a fourth side, and a fifth side of the die 88. In various implementations, the top 102 of the notch 104 may be considered part of the sixth side 98 of the die. In this sense, the die may be covered by the second molding compound 148 on the sixth side of the die. A metal layer 100 may be coupled to the sixth side 98 of the die. In various implementations, more than one metal layer may be coupled to the sixth side 98 of the die. The metal may include, by non-limiting example, gold, titanium, nickel, silver, copper, or any combination or alloy thereof. In various implementations, the notch 104 may extend around a perimeter of the die. In various implementations, a molding compound may cover the sides 106 of the metal layer 100.

Figure 8:
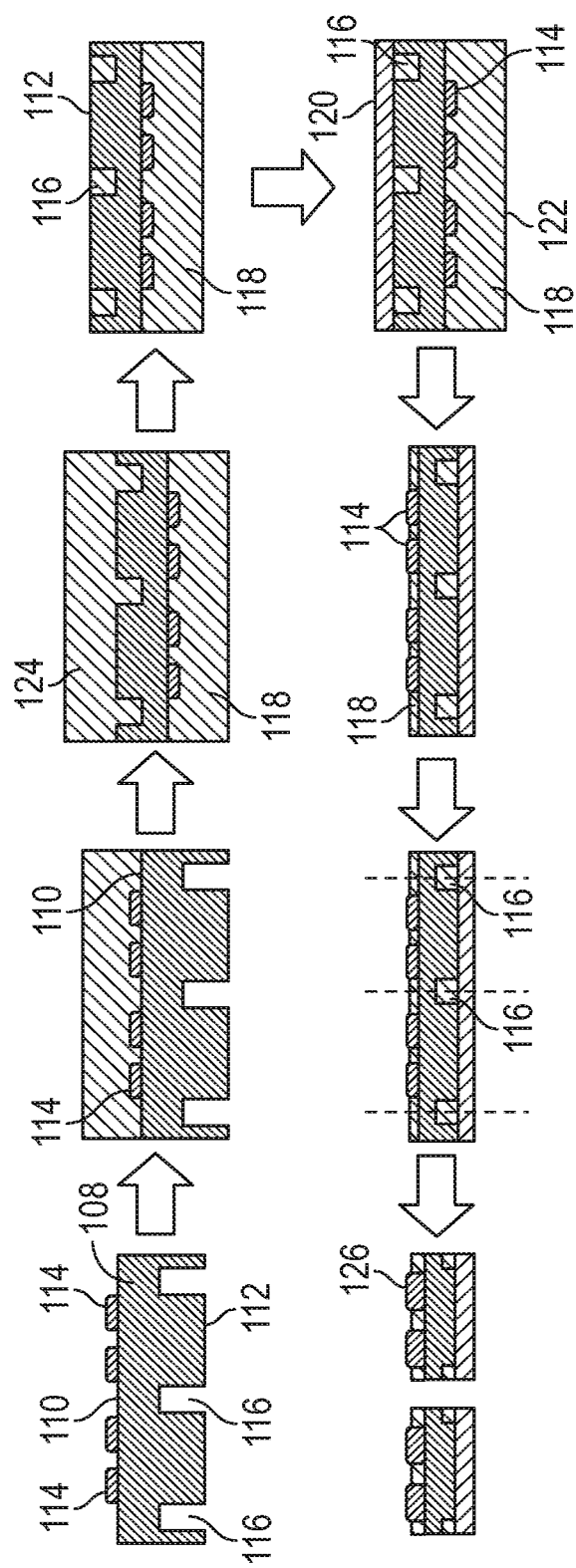
FIG. 8 is an illustration of a process flow for forming an ultra-thin semiconductor package with a portion of the die exposed.

Referring now to FIG. 8, another implementation of process flow for a method implementation for forming an ultra-thin semiconductor device with a portion of the die exposed is illustrated. The process flow illustrates cross sectional side views of the wafer and die. In various implementations, the method includes providing a wafer 108. The wafer 108 has a first side 110 and a second side 112. The wafer 108 may be, by non-limiting example, silicon, gallium nitride, silicon carbide, or other wafer substrate material disclosed herein. The first side 110 of the wafer 108 includes or is coupled to a plurality of electrical contacts 114. The electrical contacts 114 may be metallic or any other electrically conductive material disclosed herein.

In various implementations, the method for forming the ultra-thin semiconductor package includes forming a plurality of notches 116 in the second side 112 of the wafer 108. While not shown in FIG. 8, it is understood that the plurality of notches intersect one another in a substantially perpendicular direction. The notches 116 formed may be any depth previously disclosed herein, any shape previously disclosed herein, and formed using any method previously disclosed herein.

The method for forming the ultra-thin semiconductor package of FIG. 8 includes coating the first side 110 of the wafer 108 with a first molding compound 118. The first molding compound 118 may also cover the electrical contacts 114. The first molding compound 118 may be applied using any method previously disclosed herein, and may be any type previously disclosed herein. In various implementations, the first molding compound 118 may be cured or heat treated as described above in relation to FIG. 1.

In various implementations, the method for forming an ultra-thin semiconductor package may include grinding the second side 112 of the wafer 108 to a desired thickness. The second side of the wafer may be ground using any grinding method disclosed herein, and may be ground to any thickness described herein that still allows the notches to exist in the material of the wafer itself. In other implementations, the second side of the wafer is not ground.

The method of forming the ultra-thin semiconductor package as illustrated in FIG. 8 includes coating the second side 112 of the wafer 108 and the interiors of the plurality of notches 116 with a second molding compound 124. The second molding compound may be any type disclosed herein and may be applied and cured using any method described herein.

The method of forming the ultra-thin semiconductor package as illustrated in FIG. 8 includes grinding the second molding compound 124 to a desired thickness. In various implementations, the second molding compound is ground to expose the second side of the wafer 112. In various implementations, a portion of the wafer may be ground away with the second molding compound 124. At least a portion of the plurality of notches 116 remains after grinding the second molding compound 124. The second molding compound 124 may be ground using any grinding method disclosed herein.

In various implementations, the method for forming an ultra-thin semiconductor package includes forming a back metal 120 on the second side 112 of the wafer 108 and over the plurality of notches 116. The back metal may include a single metal layer or multiple metal layers. In various implementations, the back metal may include, by non-limiting example, gold, titanium, nickel, silver, copper, or any combination or alloy thereof.

Because the wafer 108 may be thinned and the back metal 120 is applied to the thinned wafer while the entirety of the first molding compound 118 is coupled to the front side 110 of the wafer 108, it reduces warpage of the wafer. Further, as discussed in this document, wafer handling issues are reduced when thinning the wafer and applying the back metal 120 because the entirety of the molding compound 118 is still coupled to the wafer 108.

In various implementations, the method for forming an ultra-thin semiconductor package includes exposing the plurality of electrical contacts 114 covered by the first molding compound 118 by grinding a first side 122 of the first molding compound. The first side 122 of the first molding compound 118 may be ground using any method disclosed herein.

In various implementations, the method for forming an ultra-thin semiconductor package includes singulating the wafer 108, first molding compound 118, and second molding compound 124 into single die 126. The wafer may be singulated by cutting or etching through the wafer where the plurality of notches 116 were originally formed. The wafer may be singulated by using, by non-limiting example, a saw, a laser, a waterjet, plasma etching, or chemical etching. In various implementations, the Bosch process may be used to singulate the wafer 108, first molding compound 118, and second molding compound 124 into individual die.

Figure 9:
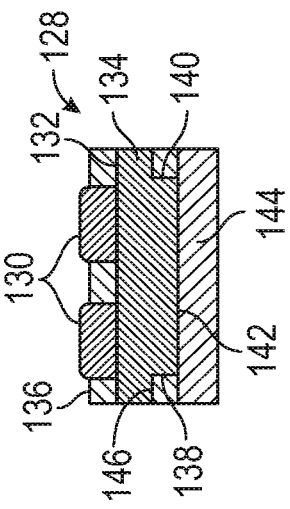
FIG. 9 is a cross sectional view of an ultra-thin semiconductor package formed by the process of FIG. 8.

Referring to FIG. 9, a cross sectional view of an ultra-thin semiconductor package formed by the process of FIG. 8 is illustrated. In various implementations, the ultra-thin semiconductor package 128 may include a power semiconductor device. Specifically, the ultra-thin semiconductor package may include a MOSFET. In other implementations, the ultra-thin semiconductor package 128 may not include a power semiconductor device. In various implementations, the ultra-thin semiconductor package 128 has a plurality of electrical contacts 130 coupled to the first side 132 of the die 134. In various implementations, the die 134 of the semiconductor package 128 may be between about 10-25 microns thick. In other implementations, the die 134 is less than about 10 microns thick. In still other implementations, the die 134 may be more than about 25 microns thick. As previously discussed, the ultra-thin nature of the power semiconductor device may improve the RDs(oN) of the device.

In various implementations, the ultra-thin semiconductor package 128 includes a molding 136 on a portion of a first side 132, a portion of a second side 138, a portion of a third side 140, a portion of a fourth side, and a portion of a fifth side of the die 134. A metal layer 144 may be coupled to the sixth side 142 of the die. In various implementations, more than one metal layer may be coupled to the sixth side 142 of the die. The metal may include, by non-limiting example, gold, titanium, nickel, silver, copper, or any combination or alloy thereof. In various implementations, a notch 146 cut out of the sixth side 142 of the die may extend around a perimeter of the die 134.

In places where the description above refers to particular implementations of ultra-thin semiconductor packages and implementing components, sub-components, methods and sub-methods, it should be readily apparent that a number of modifications may be made without departing from the spirit thereof and that these implementations, implementing components, sub-components, methods and sub-methods may be applied to other ultra-thin semiconductor packages.

What is claimed is:

1. A semiconductor package comprising:
a die comprising a notch located around a perimeter of a sixth side of the die, the die comprising a first side opposing the sixth side, the first side of the die comprising a plurality of electrical contacts;
a second molding compound coupled over the sixth side of the die and into the notch;
a first molding compound coupled over the first side of the die, the first molding compound forming a thickness above the first side; and
a metal layer coupled to the sixth side of the die;
wherein a thickness of the plurality of electrical contacts is substantially the same as the thickness of the first molding compound;
wherein an entirety of the second molding compound is coupled between the metal layer and the die;
wherein each of the metal layer, the second molding compound, and the die all extend to an outermost side surface of the semiconductor package.

2. The package of claim 1, wherein the second molding compound contacts the metal layer.

3. The package of claim 1, wherein the first molding compound and second molding compound are entirely separated by the die.

4. The package of claim 1, wherein the metal layer extends to an outermost sidewall of the semiconductor package.

5. A semiconductor package comprising:
- a die comprising a notch located around a perimeter of a sixth side of the die, the die comprising a first side opposing the sixth side, the first side of the die comprising a plurality of electrical contacts;
- a second molding compound coupled into the notch;
- a first molding compound coupled over the first side of the die, the first molding compound forming a thickness above the first side; and
- a metal layer coupled to the sixth side of the die, coupled directly over the second molding compound, and extending to an outermost side surface of the semiconductor package;
- wherein a thickness of the plurality of electrical contacts is substantially the same as the thickness of the first molding compound;
- wherein the die is exposed on four sidewalls of the semiconductor package; and
- wherein an outermost edge of the first molding compound extends to a perimeter of the first side of the die.

6. The package of claim 5, wherein a portion of a second side, a portion of a third side, a portion of a fourth side, and a portion of a fifth side of the die are exposed at an outer surface of the semiconductor package between the first molding compound and the second molding compound.

7. The package of claim 5, wherein a portion of a second side, a portion of a third side, a portion of a fourth side, and a portion of a fifth side of the die are exposed on an outer surface of the semiconductor package.

8. The package of claim 5, wherein, of the first molding compound and second molding compound, only the second molding compound contacts the metal layer.

9. The package of claim 5, wherein the first molding compound and second molding compound are separated by a second side, a third side, a fourth side, and a fifth side of the die.

10. The package of claim 5, wherein the first molding compound is entirely separated from the second molding compound by the die.

11. The semiconductor package of claim 5, wherein an entirety of the second molding compound is within the notch and between the die and the metal layer.

12. A semiconductor package comprising:
- a die comprising a notch located around a perimeter of a sixth side of the die, the die comprising a first side opposing the sixth side, the first side of the die comprising a plurality of electrical contacts;
- an entirety of a second molding compound coupled within the notch;
- a first molding compound coupled over the first side of the die; and
- a metal layer coupled to the sixth side of the die, coupled directly over the second molding compound, and extending to an outermost sidewall of the semiconductor package;
- wherein an outermost edge of the metal layer, an outermost edge of the second molding compound, an outermost edge of the die, an outermost edge of the first molding compound, and an outermost sidewall of the semiconductor package all lie within a same plane.

13. The semiconductor package of claim 12, wherein an outer perimeter of the metal layer is the same as an outer perimeter of the semiconductor package.

14. The semiconductor package of claim 12, wherein the die is exposed on four sidewalls of the semiconductor package.

15. The semiconductor package of claim 12, wherein the second molding compound is the only molding compound that contacts the metal layer.

* * * * *